United States Patent
Kwon et al.

(10) Patent No.: US 11,346,953 B2
(45) Date of Patent: May 31, 2022

(54) PHOTO DETECTOR, PHOTO DETECTION SYSTEM, LIDAR DEVICE AND VEHICLE

(71) Applicant: Kabushiki Kaisha Toshiba, Minato-ku (JP)

(72) Inventors: Honam Kwon, Kawasaki (JP); Kazuhiro Suzuki, Meguro (JP); Ikuo Fujiwara, Yokohama (JP); Keita Sasaki, Yokohama (JP); Yuki Nobusa, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 492 days.

(21) Appl. No.: 16/288,991

(22) Filed: Feb. 28, 2019

(65) Prior Publication Data
US 2020/0025934 A1 Jan. 23, 2020

(30) Foreign Application Priority Data
Jul. 20, 2018 (JP) .............................. JP2018-136849

(51) Int. Cl.
| | | |
|---|---|---|
| H01L 27/146 | (2006.01) | |
| G01S 17/931 | (2020.01) | |
| H01L 31/107 | (2006.01) | |
| G01S 7/4861 | (2020.01) | |

(52) U.S. Cl.
CPC .......... *G01S 17/931* (2020.01); *G01S 7/4861* (2013.01); *H01L 27/14629* (2013.01); *H01L 31/107* (2013.01)

(58) Field of Classification Search
CPC ............. H01L 31/107; H01L 27/14629; H01L 27/1463; G01S 7/4861
See application file for complete search history.

(56) References Cited

U.S. PATENT DOCUMENTS

| | | |
|---|---|---|
| 2004/0190377 A1 | 9/2004 | Lewandowski et al. |
| 2005/0212071 A1 | 9/2005 | Yue et al. |
| 2008/0308738 A1 | 12/2008 | Li et al. |
| 2011/0186918 A1 | 8/2011 | Sung |
| 2012/0028401 A1 | 2/2012 | De Munck et al. |
| 2013/0062500 A1* | 3/2013 | Oh .......................... H04N 5/341 250/201.1 |
| 2015/0001660 A1 | 1/2015 | Fukumizu et al. |

(Continued)

FOREIGN PATENT DOCUMENTS

| | | |
|---|---|---|
| JP | 7-312443 | 11/1995 |
| JP | 10-150150 | 6/1998 |

(Continued)

*Primary Examiner* — Thanh Luu
(74) *Attorney, Agent, or Firm* — Oblon, McClelland, Maier & Neustadt, L.L.P.

(57) ABSTRACT

In one embodiment, a photo detector includes a plurality of photo detection elements, a plurality of trenches each provided among a plurality of the photo detection elements, and a wiring provided between the two photo detection elements out of the plurality of photo detection elements to electrically connect to the two photo detection elements. The trenches surround the 2·m (m is a positive integer) photo detection elements including the two photo detection elements. And the two photo detection elements are lined in a direction orthogonal to an extending direction of the metal layer for electrical connection.

14 Claims, 11 Drawing Sheets

(56) References Cited

U.S. PATENT DOCUMENTS

| | | | |
|---|---|---|---|
| 2017/0170216 A1 | 6/2017 | Lee et al. | |
| 2018/0204961 A1* | 7/2018 | Lee | |
| 2018/0252812 A1* | 9/2018 | Kitano | G01S 17/10 |
| 2020/0075644 A1* | 3/2020 | Aoki | H01L 27/1464 |

FOREIGN PATENT DOCUMENTS

| | | | |
|---|---|---|---|
| JP | 11-87684 | | 3/1999 |
| JP | 2000-101028 | | 4/2000 |
| JP | 2004-253633 | | 9/2004 |
| JP | 2005-295553 | | 10/2005 |
| JP | 2007-67393 | | 3/2007 |
| JP | 2007-80905 | | 3/2007 |
| JP | 2007-531281 | | 11/2007 |
| JP | 2008-311651 | | 12/2008 |
| JP | 2010-103316 | | 5/2010 |
| JP | 2012-501535 | | 1/2012 |
| JP | 2012-33928 | | 2/2012 |
| JP | 2015-12043 | | 1/2015 |
| JP | 2015084392 A | * | 4/2015 |
| JP | 2017-33962 A | | 2/2017 |
| JP | 2017-45873 A | | 3/2017 |
| WO | WO 2018/055449 A2 | | 3/2018 |

* cited by examiner

PHOTO DETECTOR, PHOTO DETECTION SYSTEM, LIDAR DEVICE AND VEHICLE

CROSS-REFERENCE TO RELATED APPLICATION

This application is based upon and claims the benefit of priority from the prior Japanese Patent Application No. 2018-136849, filed on Jul. 20, 2018, the entire contents of which are incorporated herein by reference.

FIELD

Embodiments described herein relate generally to a photo detector, a photo detection system, a lidar device and a vehicle.

BACKGROUND

To provide a photo detector with high sensitivity is desired.

DETAILED DESCRIPTION

According to one embodiment, a photo detector includes a plurality of photo detection elements, a plurality of trenches each provided among a plurality of the photo detection elements, and a wiring provided between the two photo detection elements out of the plurality of photo detection elements to electrically connect to the two photo detection elements. The trenches surround the 2·m (m is a positive integer) photo detection elements including the two photo detection elements. And the two photo detection elements are lined in a direction orthogonal to an extending direction of the metal layer for electrical connection.

Hereinafter, further embodiments will be described with reference to the drawings. Ones with the same symbols show the corresponding ones. In addition, the drawings are schematic or conceptual, and accordingly, the relation between a thickness and a width in each portion, and a ratio of sizes between portions are not necessarily identical to those of the actual ones. In addition, even when the same portions are shown, the dimensions and the ratio thereof may be shown differently depending on the drawings.

First Embodiment

Figure 1:
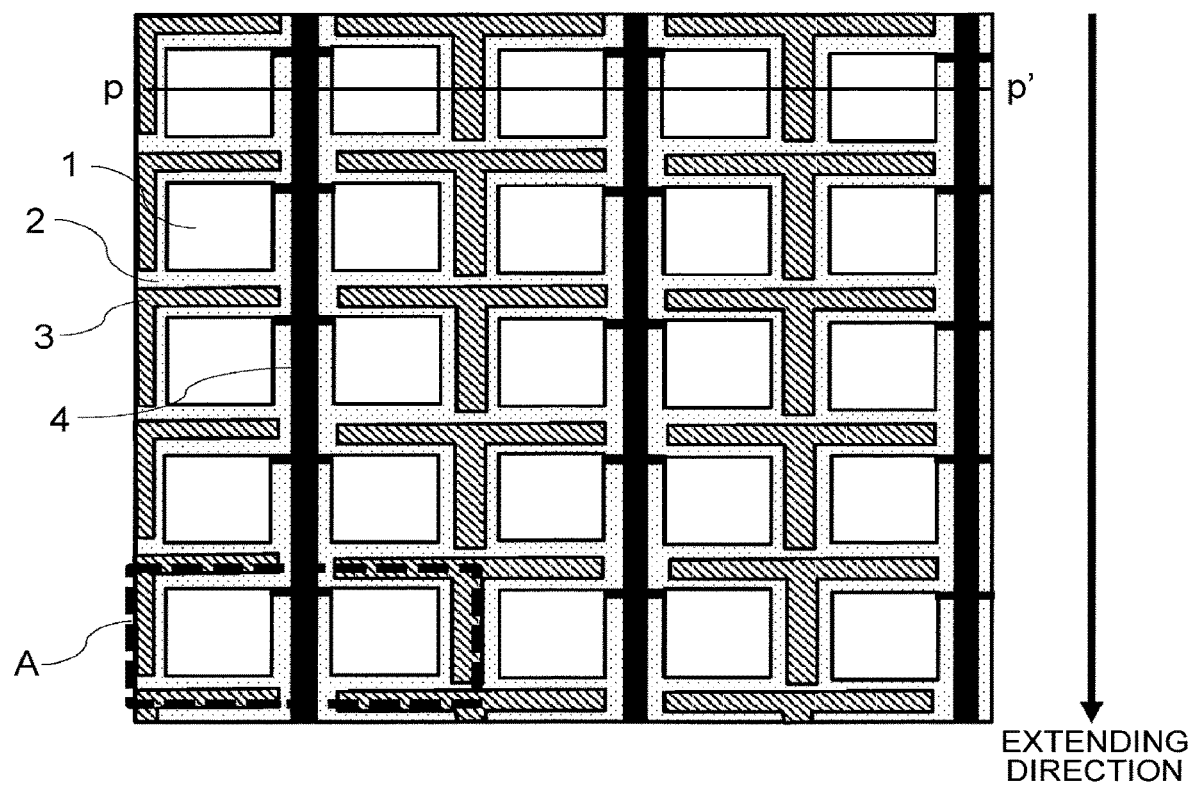
FIG. 1 is a diagram showing a photo detector according to a first embodiment.

FIG. 1 is a diagram showing a photo detector according to a first embodiment. This photo detector can detect light as an electric signal by converting incident light into electric charge.

The photo detector includes a plurality of photo detection elements 1 arranged in an array shape, a light non-detection region 2 provided among a plurality of the photo detection elements 1, trenches 3 provided among a plurality of the photo detection elements 1 in the light non-detection region 2, and wirings 4 each of which is provided between the two photo detection elements 1 in the light non-detection region 2 and electrically connects to the two photo detection elements 1. In addition, the trenches 3 are provided so as to surround the 2·m (m is a positive integer) photo detection elements 1 including the two photo detection elements 1. A direction in which the metal layer for electrical connection 4 extends is set to an extending direction, and the two photo detection elements 1 are lined in a direction orthogonal to the extending direction. Here, "an upper side" is a side to which light is made incident. "To surround" in the present embodiment intends not only to completely surround, but even though the trenches 3 are separate to each other, if an orbit of a polygon (a quadrangle, in the first embodiment) can be drawn like A shown in FIG. 1 by tracing the trenches 3, such a case shall correspond to "to surround".

The photo detection element 1 detects light by converting incident light into electric charge. For example, the photo detection element 1 is an avalanche photo diode to perform a Geiger mode operation.

The light non-detection region 2 is a region in which the incident light cannot be detected.

The trenches 3 are provided so that the adjacent photo detection elements 1 do not interfere with each other.

The metal layer for electrical connection 4 is provided so as to output an electric signal which the photo detection element has converted to a drive and reading unit (not shown). In addition, the metal layer for electrical connection 4 also includes a quench resistor (not shown). The quench resistor is provided so that multiplication can be converged, in order to shorten a time after the photo detection element 1 has detected one photon until the photo detection element 1 can detect a next photon.

Figure 2:
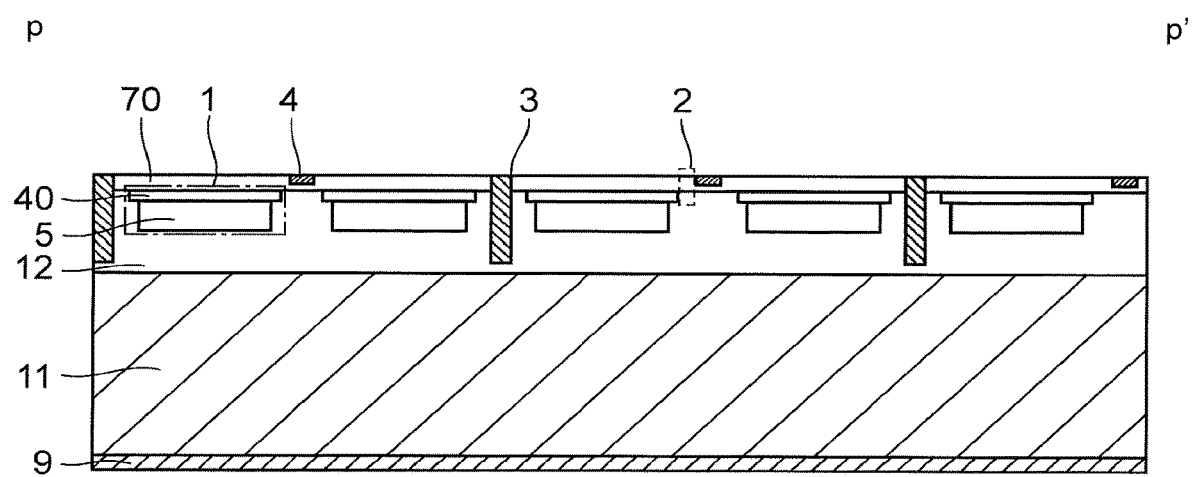
FIG. 2 is a diagram showing a p-p' cross section of the photo detection element of the photo detector shown in FIG. 1.

FIG. 2 is a diagram showing a p-p' cross section of the photo detection element 1 of the photo detector shown in FIG. 1.

In the p-p' cross section of FIG. 2, the photo detector further includes a back surface electrode 9, a high concentration p-type substrate 11 provided on the back surface electrode 9, an epilayer 12 which is provided on the high concentration p-type substrate 11 and forms the photo detection element 1, and a protective layer 70 provided on the photo detection element 1. The photo detection element 1 includes a p-type semiconductor layer 5, and an n-type semiconductor layer 40 provided on the p-type semiconductor layer 5. In a part of the protective layer 70, the metal layer for electrical connection 4 is electrically connected to the n-type semiconductor layers 40. In addition, the trenches 3 are formed by vertically processing the epilayer 12 so as to sandwich the two photo detection elements 1 which are electrically connected by the metal layer for electrical connection 4 in a direction crossing with a laminating direction. A side wall of a recess formed by performing the vertical processing functions as the trench 3 without change, but if the side wall is covered with an insulating film or a metal film, or the recess is filled with an insulating material or metal, crosstalk can be further reduced.

The back surface electrode 9 is provided so that a voltage is applied to the back surface electrode 9 to cause a potential difference with the metal layer for electrical connection 4. A material of the back surface electrode 9 is aluminum or an aluminum-containing material, for example, or another metal material which is combined with that material.

The p-type semiconductor layer 5 is a layer in which impurity (boron, for example) is added to a high purity semiconductor (silicon, for example).

The n-type semiconductor layer 40 is a layer in which impurity (phosphorus, for example) is added to a high impurity semiconductor (silicon, for example).

The protective layer 70 is provided for protecting the metal layer for electrical connection 4 so that the metal layer for electrical connection 4 does not come into contact with the outside and is not short-circuited. A material of the protective layer 70 is a silicon oxide film or a silicon nitride film, for example.

Figure 3:
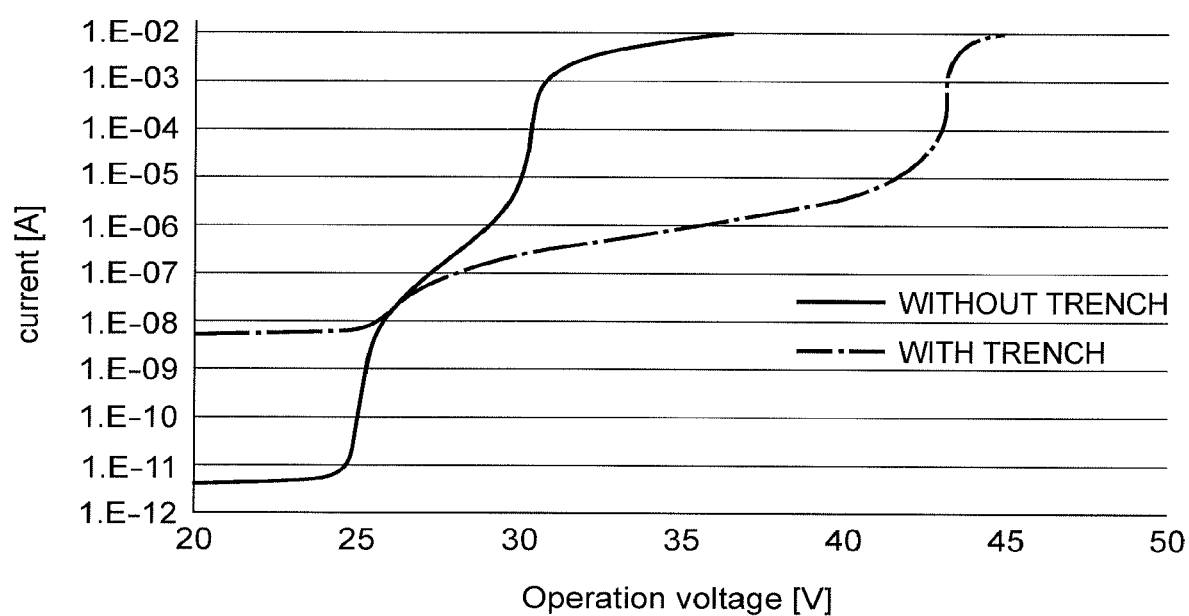
FIG. 3 is a diagram showing the relation of the presence or absence of the trench and an IV characteristic.

FIG. 3 is a diagram showing the relation of the presence or absence of the trench 3 and an IV characteristic.

In the case in which the trench 3 is provided, when an operation voltage is increased, a current gradually rises when the operation voltage is increased from 25 V that is a breakdown voltage, and the current sharply increases and diverges when the operation voltage is increased from 44 V. On the other hand, in the case in which the trench 3 is not provided, when the operation voltage is increased, the current sharply increases when the operation voltage is increased from 25 V that is the breakdown voltage, and the current diverges when the operation voltage is 30 V. When a difference from the breakdown voltage to the diverging voltage is defined as $\Delta 0$, $\Delta Vc$ in the case in which the trench 3 is provided is 19 V (=, 44 V–25 V), and $\Delta Vc$ in the case in which the trench 3 is not provided is 5 V (=30 V–25 V). Accordingly, since the photo detector formed with the trenches 3 can reduce excess noise such as crosstalk and an afterpulsing, a voltage at which the current begins to diverge becomes large, and thereby $\Delta Vc$ is enlarged. As $\Delta Vc$ becomes larger, so a voltage which can be applied to the photo detector can be made larger, and thereby when the trenches 3 are formed in the photo detector, improvement of sensitivity of the photo detector is obtained.

Figure 4A:
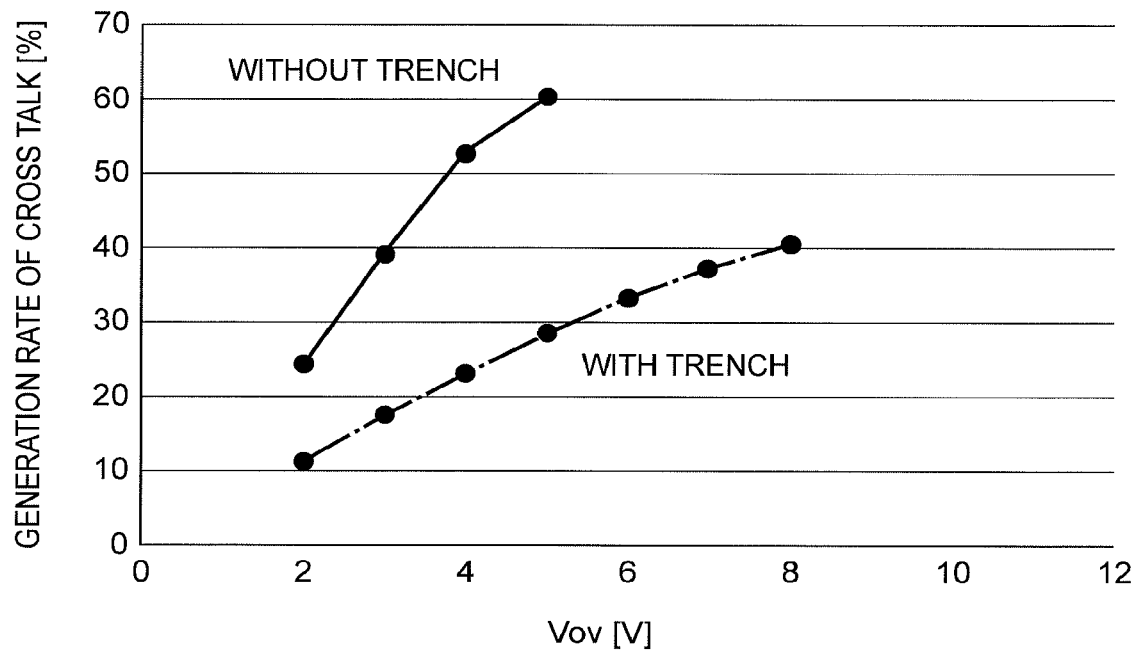
FIGS. 4A, 4B are diagram each showing the relation of the presence or absence of the trench and excess noise.
Figure 4B:
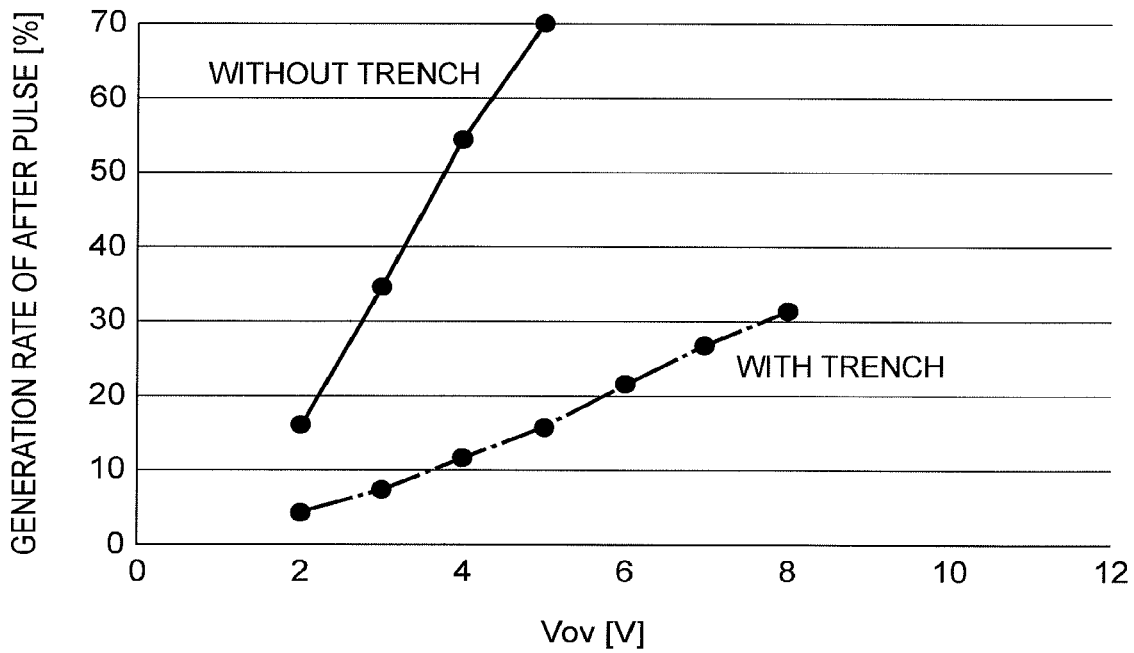

FIGS. 4A, 4B are diagram each showing the relation of the presence or absence of the trench 3 and excess noise.

Vov in FIGS. 4A, 4B is an over voltage to be applied exceeding the breakdown voltage. In addition, crosstalk as the excess noise is a ratio of the number of pulses generated during a definite time and the number of a plurality of pulses simultaneously generated, and an afterpulsing is a ratio of the number of generated pulses and the number of pulses which are excited and generated after a definite time resulting from the generated pulse. As shown in FIG. 4A, when the trench 3 is formed, the crosstalk is greatly reduced compared with a case in which the trench 3 is not formed. In addition, as shown in FIG. 4B, it is found that the afterpulsing is greatly reduced when the trench 3 is formed.

Figure 5A:
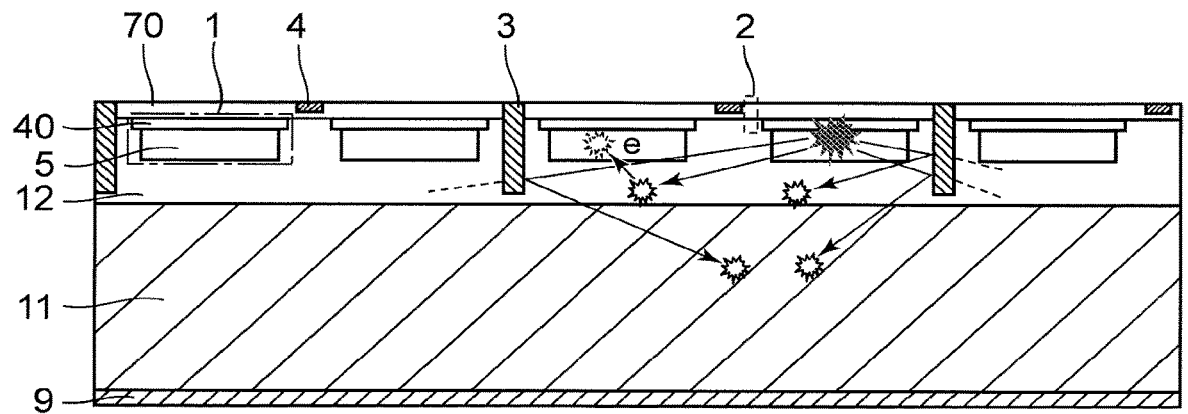
FIGS. 5A, 5B are diagram showing the presence or absence of the trench and an operation model of a photo detector.
Figure 5B:
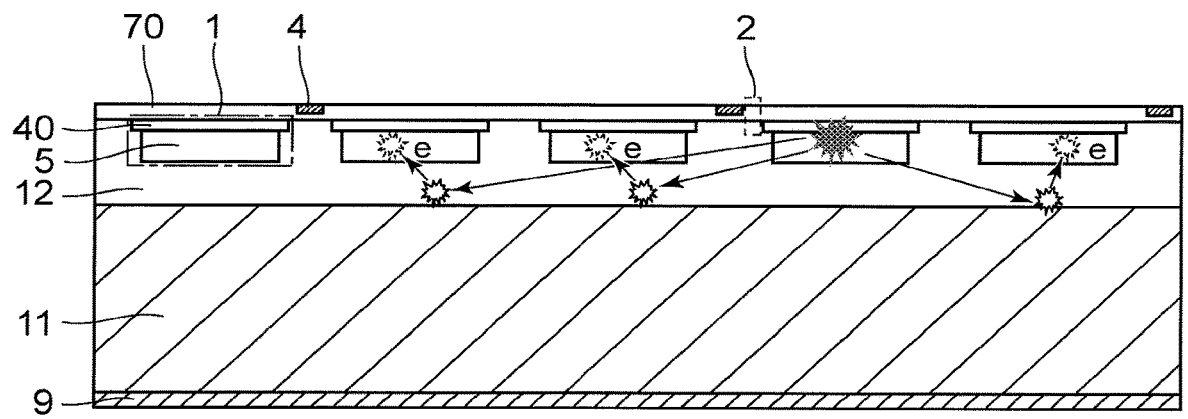

FIGS. 5A, 5B are diagram showing the presence or absence of the trench 3 and an operation model of a photo detector.

FIG. 5A shows an operation model in a case in which the trenches 3 of the present embodiment are formed, and FIG. 5B shows an operation model in a case prepared as a comparative example in which the trenches 3 are not provided.

As shown in FIG. 5A, secondary photons are generated in a process in which a carrier generated in the one photo detection element 1 performs avalanche multiplication. The secondary photons spread in all directions, and since a refractive index of the epilayer 12 is different from that of the trench 3, refraction of the photon occurs. Some secondary photons proceed in a direction in which the secondary photon hardly functions as the excess noise. In addition, some secondary photons are totally reflected by the trench 3 and return to the inside of the photo detection element 1 that is a secondary photon generation source, and there is concern that the secondary photons generate a carrier and become the excess noise, but a current flows through the quench resistor and thereby a voltage applied to the photo detection element 1 becomes low to make the avalanche multiplication rate low, and as a result, the secondary photons do not appear as the pulse output. Accordingly, the secondary photons are hardly detected as the excess noise. On the other hand, since the trenches 3 are not formed as shown in FIG. 5B, the secondary photons proceed to the adjacent photo detection elements 1 and thereby the excess noise becomes large.

Next, a manufacturing method will be described.

p-type silicon of a low concentration (for example, not less than 1E14/cm$^3$ ($1.0 \times 10^{14}$/cm$^3$) and not more than 1E16/cm$^3$ ($1.0 \times 10^{16}$/cm$^3$)) is epitaxially grown (for example, not less than 5 μm and not more than 15 μm) on the high concentration p-type substrate 11 (for example, a silicon substrate, a diameter is 8 inches, a thickness is 725 μm) to form the epilayer 12. The p-type semiconductor layer 5 (for example, 3E12/cm$^3$ ($3.0 \times 10^{12}$/cm$^3$)) and the n-type semiconductor layer 40 (for example, 5E14/cm$^3$ ($5.0 \times 10^{14}$/cm$^3$)) are respectively formed in the vicinity of the surface of the epilayer 12 by ion implantation, and the metal layer for electrical connection 4 (for example, poly-Si or a metal film) is connected onto the n-type semiconductor layer 40 via the contact. The protective film 70 is formed so as to cover the metal layer for electrical connection 4. When to form a trench before or after forming the metal layer for electrical connection 4 is called pre-forming trenching or post-forming trenching, in the pre-forming trenching, it is possible to completely surround the photo detection element 1 with the trench seen from the light incident direction, but the processes of embedding the trenches 3 and forming the protective layer 70 and the metal layer for electrical connection 4 might be restricted. In addition, in the post-forming trenching, since the trench is formed after the metal layer for electrical connection 4 has been formed, it becomes impossible to completely surround the photo detection element 1 with the trench seen from the light incident direction so that the metal layer for electrical connection 4 is not disconnected, but the manufacturing can be made simply. In the photo detector according to the first embodiment, the post-forming trenching is used, but without being limited to the post-forming trenching, the photo detector according to the first embodiment can be applied to both of the pre-forming trenching and the post-forming trenching.

Figure 6:
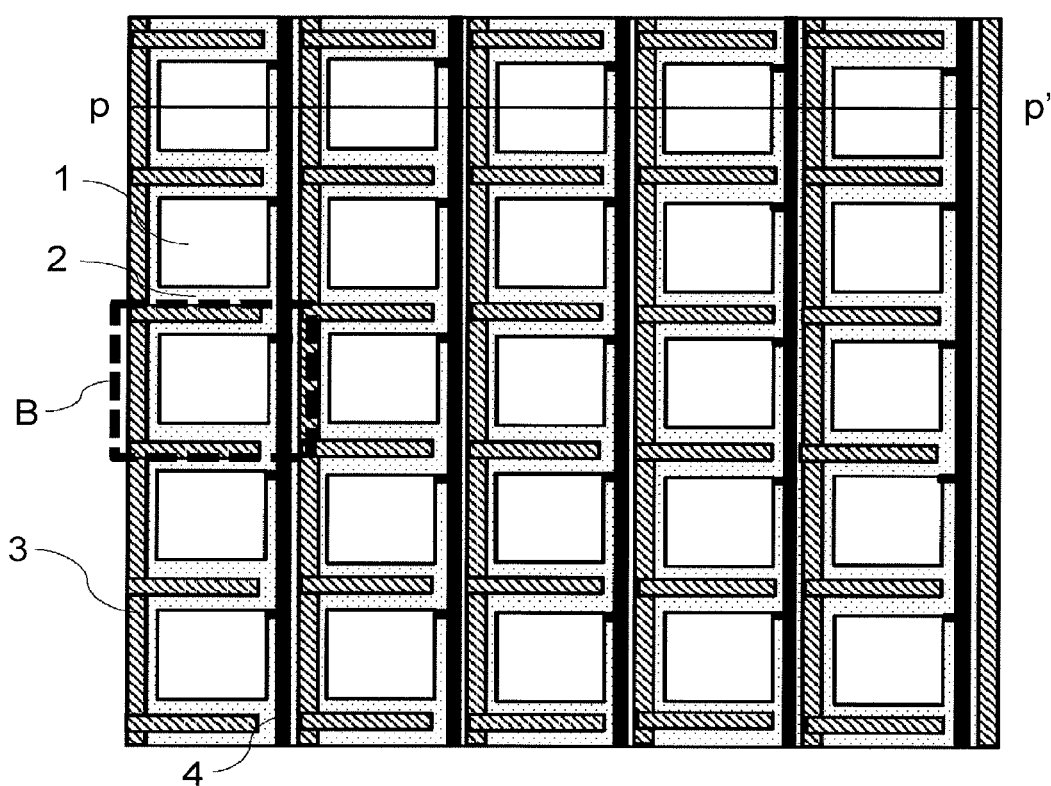
FIG. 6 is a diagram showing a photo detector using the trench of a comparative example.

FIG. 6 is a diagram showing a photo detector using the trench of a comparative example.

As shown in FIG. 6, in a photo detector of a comparative example, the trenches 3 are formed so as to surround the photo detection element 1 like B for each of photo detection elements 1. According to this structure, the photo detector has an effect to minimize influence by a carrier and secondary photons generated in the one photo detection element 1, but in order to provide the trench 3 and the metal layer for electrical connection 4, a distance between the photo detection elements 1 is to be made large, and thereby an opening ratio of the photo detection element 1 might be decreased. In addition, since a ratio of the trenches 3 to the whole of the photo detector becomes large, the excess noise due to defects caused at the time of processing the trenches might become large.

On the other hand, in the photo detector according to the first embodiment, the trenches 3 are formed so as to surround the two photo detection elements 1. In the photo detector according to the first embodiment, the effect to suppress influence by a carrier and secondary photons generated in the photo detection element 1 is the same as or smaller, compared with the structure of the comparative example in which the one photo detection element 1 is surrounded by the trenches 3, but it is not necessary to concurrently provide the trench 3 and the metal layer for electrical connection 4 between the adjacent two photo detection elements 1. Accordingly, the photo detector according to the first embodiment can improve the opening ratio more than the photo detector of the comparative example. In addition, the photo detector according to the first embodiment can make a ratio of the trenches 3 to the whole of the photo detector smaller than the photo detector of the comparative example. Accordingly, it is possible to suppress the excess noise due to defects caused at the time of processing the trenches. The photo detector with high sensitivity is realized by making the opening ratio large and suppressing the excess noise.

Figure 7:
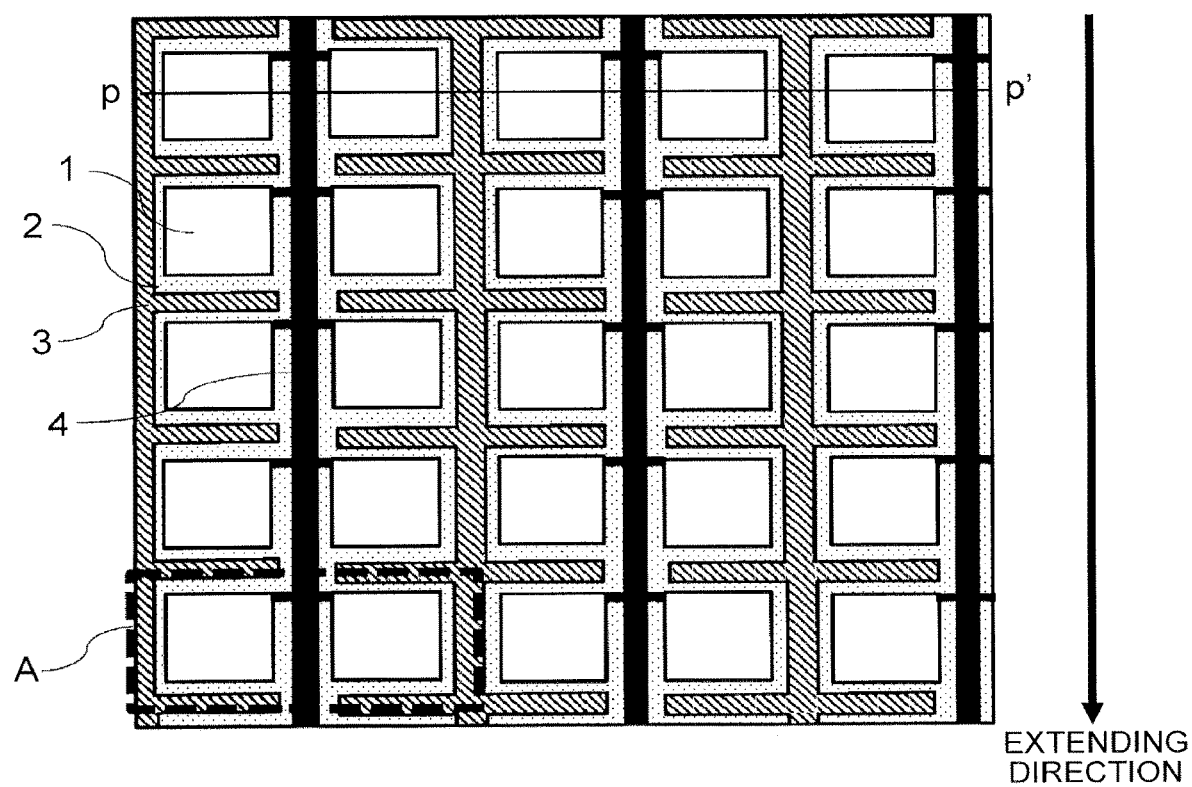
FIG. 7 is a diagram showing a modification of the photo detector according to the first embodiment.

For example, the structure shown in FIG. 1 may be modified to the structure shown in FIG. 7. In the structure shown in FIG. 7, the trenches 3 adjacent to each other in the extending direction are connected to each other. The structure shown in FIG. 7 is a more preferable structure because crosstalk is small as compared with the structure shown in FIG. 1.

Figure 8:
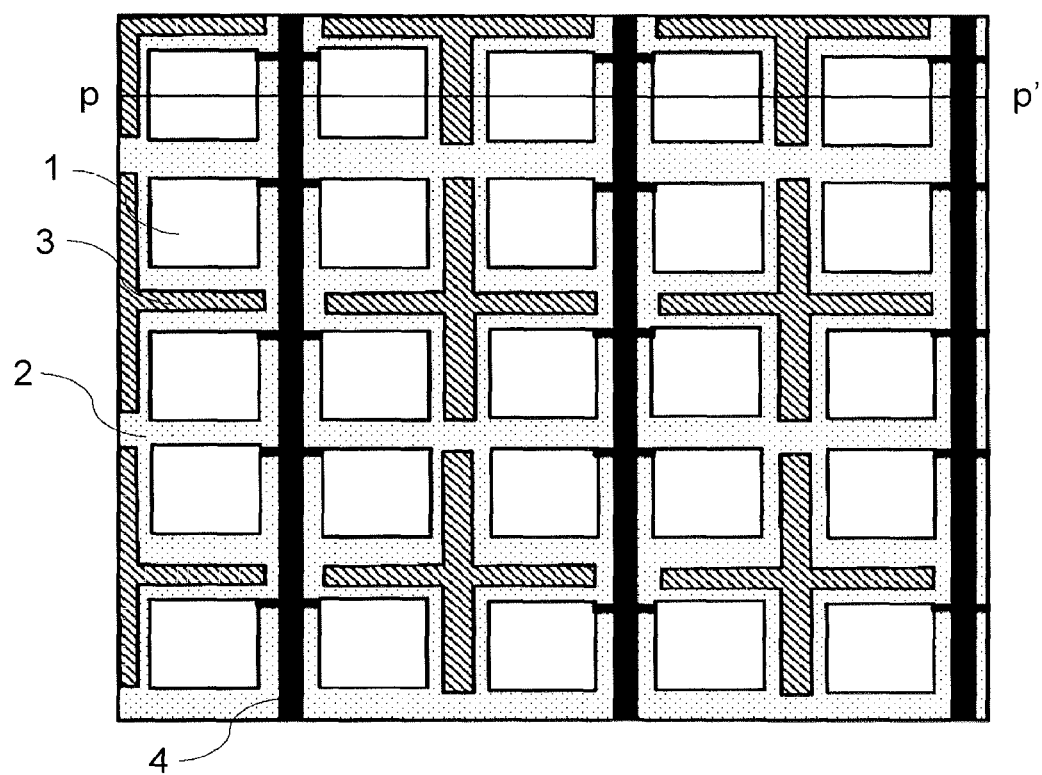
FIG. 8 is a diagram showing a modification 1 of the photo detector according to the first embodiment.

(Modification) FIG. 8 is a diagram showing a modification 1 of the photo detector according to the first embodiment.

In the modification 1 of the photo detector according to the first embodiment, cross-shaped trenches 3 are formed, and the cross-shaped trenches 3 surround the four photo detection elements 1 which are lined in the extending direction and in a direction orthogonal to the extending direction.

In the example of FIG. 8, the trenches 3 surround the four photo detection elements 1, namely two in the extending direction and two in the direction orthogonal to the extending direction, however, the number of the photo detection elements 1 is not limited to four, but the trenches 3 have only to surround the 2·m (m is an integer) photo detection elements 1.

The modification 1 of the photo detector according to the first embodiment can make a ratio of the trenches 3 to the whole of the photo detector smaller than the photo detector according to the first embodiment. Accordingly, it is possible to further suppress the excess noise due to defects caused at the time of processing the trenches.

Figure 9:
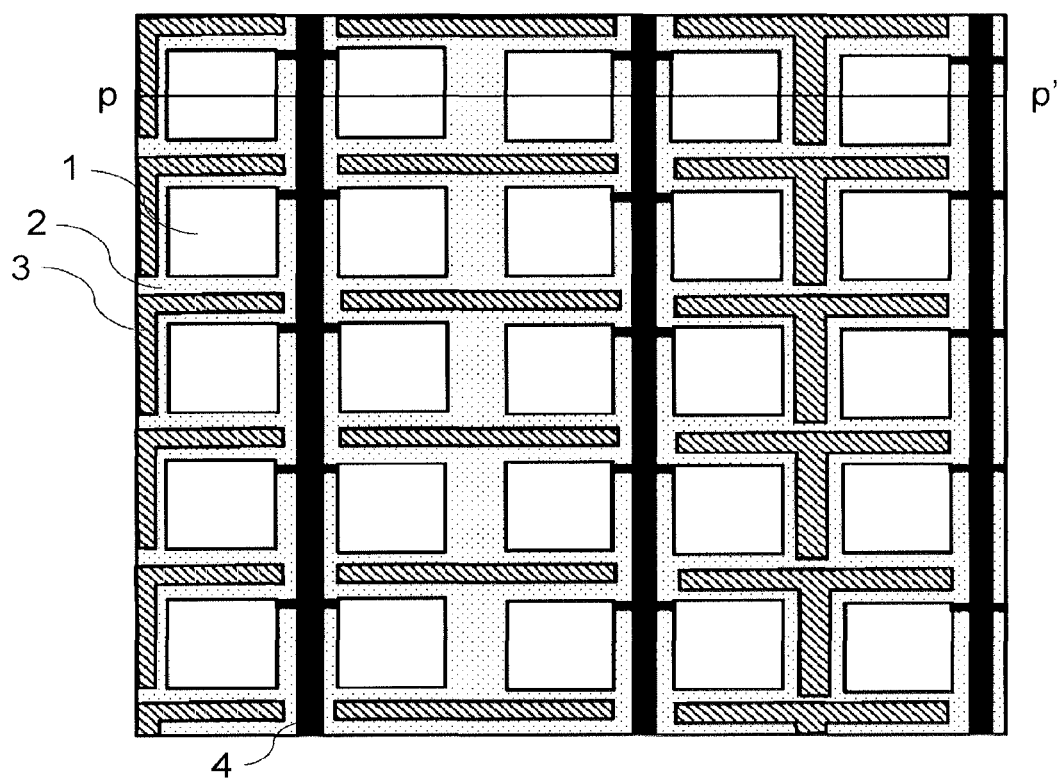
FIG. 9 is a diagram showing a modification 2 of the photo detector according to the first embodiment.

FIG. 9 is a diagram showing a modification 2 of the photo detector according to the first embodiment.

In the modification 2 of the photo detector according to the first embodiment, the trenches 3 surround the four photo detection elements 1 which are lined in the direction orthogonal to the extending direction.

In the example of FIG. 9, the trenches 3 surround the four photo detection elements 1, but the number of the photo detection elements 1 is not limited to four, but the trenches 3 have only to surround the 2·m (m is an integer) photo detection elements 1.

The modification 2 of the photo detector according to the first embodiment can obtain the effect of the modification 1 of the photo detector according to the first embodiment. In addition, the trenches 3 surround a plurality of the photo detection elements 1 lined in a rectangular shape, and thereby a distance between the photo detection elements 1 at the both ends can be made large, and accordingly, it is possible to reduce the excess noise due to crosstalk.

In addition, the photo detection element 1 according to the first embodiment shown in the drawing has been a quadrangle seen from a light incident side, but the photo detection element of a polygonal shape or a circular shape can obtain the similar effect.

In addition, in the first embodiment, the trenches 3 have surrounded the 2·m (m is a positive integer) photo detection elements 1, but the number of the photo detection elements is not limited to this. For example, even in a case in which the trenches surround the 3·m (m is a positive integer) photo detection elements 1, the above-described similar effect can be obtained.

Second Embodiment

Figure 10:
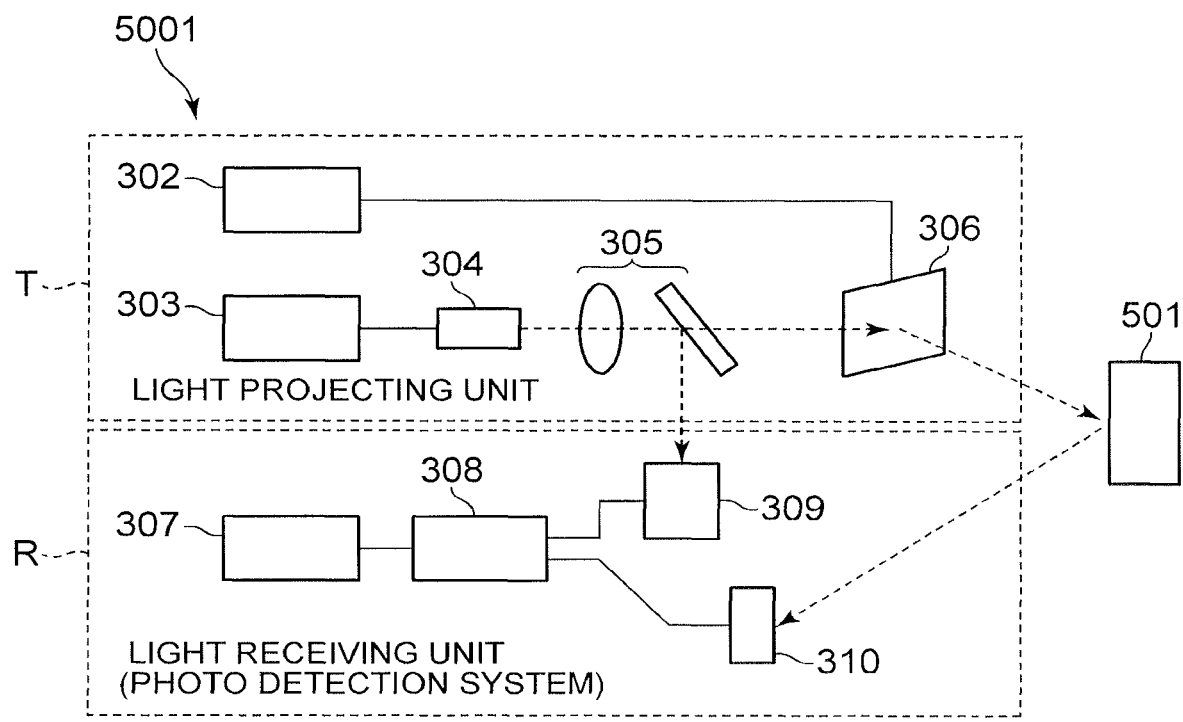
FIG. 10 is a diagram showing a lidar device according to the present embodiment.

FIG. 10 shows a lidar (Laser Imaging Detection and Ranging: LIDAR) device 5001 according to the present embodiment.

This embodiment is composed of a line light source and a lens, and can be applied to a long distance photographing subject detection system (LIDAR), and so on. The lidar device 5001 is provided with a light projecting unit T to project laser light to an object 501, and a light receiving unit R (also called a photo detection system) which receives the laser light from the object 501, measures a time required for the laser light to reciprocate to the object 501, and converts the time into a distance.

In the light projecting unit T, a laser light oscillator (also called a light source) 304 oscillates laser light. A drive circuit 303 drives the laser light oscillator 304. An optical system 305 extracts a part of the laser light as reference light, and irradiates the object 501 with the other laser light via a mirror 306. A mirror controller 302 controls the mirror 306 to project the laser light to the object 501. Here, light projecting means to project light.

In the light receiving unit R, a reference light detector 309 detects the reference light extracted by the optical system 305. A photo detector 310 receives reflected light from the object 501. A distance measuring circuit 308 measures a distance to the object 501, based on the reference light detected by the reference light photo detector 309 and the reflected light detected by the photo detector 310. An image recognition system 307 recognizes the object 501, based on the result measured by the distance measuring circuit 308.

The lidar device 5001 employs a light flight time ranging method (Time of Flight) which measures a time required for a laser light to reciprocate to the object 501 and converts the time into a distance. The lidar device 5001 is applied to an on-vehicle drive-assist system, remote sensing, and so on. When any of the photo detectors of the above-described embodiment is used as the photo detector 310, the lidar device 5001 expresses good sensitivity particularly in a near infra-red region. For the reason, it becomes possible to apply the lidar device 5001 to a light source in a human-invisible wavelength band. The lidar device 5001 can be used for obstacle detection for vehicle, for example.

In addition, it is preferable that a plurality of sets of the photo detector 310 and the light source 304 are provided, and the arrangement relation thereof is previously set to software (can be replaced by a circuit). It is preferable that regarding the arrangement relation of the sets of the photo detector 310 and the light source 304, the sets are provided at an equal interval. By this means, the output signals of the respective photo detectors 310 are complemented with each other, and thereby an accurate three-dimensional image can be generated.

Figure 11:
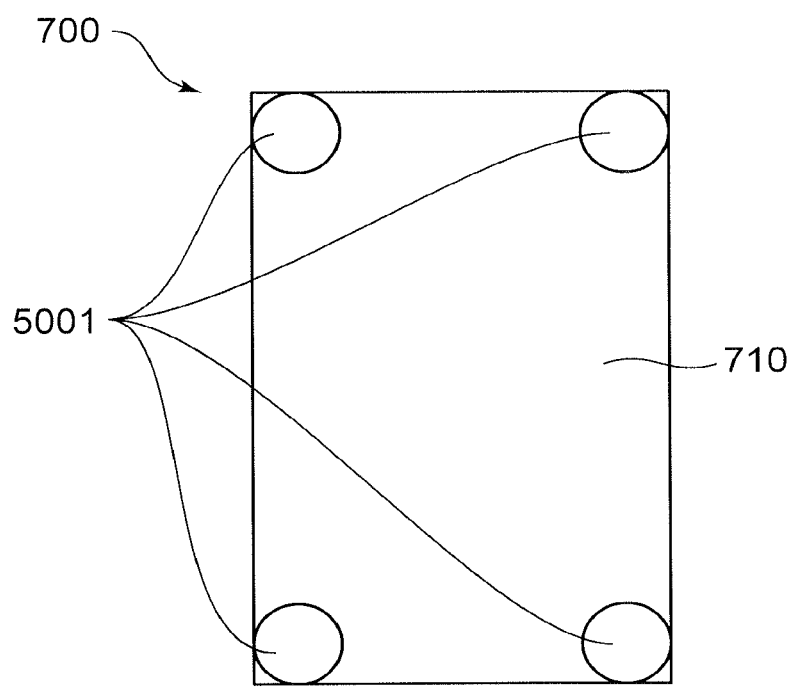
FIG. 11 is a schematic top view of a vehicle provided with the lidar device according to the present embodiment.

FIG. 11 is a schematic top view of a vehicle provided with the lidar device according to the present embodiment.

A vehicle 700 according to the present embodiment is provided with the lidar devices 5001 at the four corners of a vehicle body 710.

The vehicle according to the present embodiment is provided with the lidar devices at the four corners of the vehicle body, and accordingly it can detect environment in the whole directions of the vehicle by the lidar devices.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A photo detector comprising:
   a plurality of photo detection elements arranged in a first direction and a second direction that is orthogonal to the first direction and including at least a first photo detection element and a second photo detection element that have facing sides facing each other and adjacent to each other side by side in the second direction;
   a first wiring which is provided between the facing sides of the first photo detection element and the second photo detection element, extends in the first direction, and electrically connects to the first photo detection element and the second photo detection element;
   a plurality of trenches each provided among a plurality of the photo detection elements, the trenches surrounding 2·m (m is a positive integer) photo detection elements including the first photo detection element and second photo detection element;
   wherein each trench includes trench portions which surround non-facing sides of the first and second photo detection elements, with no trench portions being present between the facing sides between which the first wiring is provided.

2. The photo detector according to claim 1, wherein:
   the 2·m photo detection elements are lined in the second direction.

3. The photo detector according to claim 2, wherein:
   an insulating film or a metal film is provided on a side wall of the trench portions.

4. The photo detector according to claim 2, wherein:
   the trench portions are filled with an insulating material or metal.

5. A photo detection system comprising:
   a photo detector according to claim 1; and
   a distance measuring circuit to calculate a light flight time from an output signal of the photo detector.

6. A lidar device comprising:
   a light source to irradiate an object with light; and
   a photo detection system according to claim 5 to detect the light reflected from the object.

7. The lidar device according to claim 6 further comprising:
   means for generating a three-dimensional image based on arrangement relation of the light source and the photo detector.

8. A vehicle comprising:
   four lidar devices according to claim 5 at respective four corners of a vehicle body.

9. The photo detector according to claim 1, wherein:
   an insulating film or a metal film is provided on a side wall of the trench portions.

10. The photo detector according to claim 1, wherein:
    the trench portions are filled with an insulating material or metal.

11. A photo detection system comprising:
    a photo detector according to claim 1; and
    a distance measuring circuit to calculate a light flight time from an output signal of the photo detector.

12. A lidar device comprising:
    a light source to irradiate an object with light; and
    a photo detection system according to claim 11 to detect the light reflected from the object.

13. The lidar device according to claim 12 further comprising:
    means for generating a three-dimensional image based on arrangement relation of the light source and the photo detector.

14. A vehicle comprising:
    four lidar devices according to claim 12 at respective four corners of a vehicle body.

\* \* \* \* \*